United States Patent
Cho

[11] Patent Number: 5,840,601
[45] Date of Patent: Nov. 24, 1998

[54] THIN FILM TRANSISTOR AND METHOD FOR MAKING SAME

[75] Inventor: Won-Ju Cho, Choongcheongbuk-Do, Rep. of Korea

[73] Assignee: LG Semicon Co., Ltd., Choongcheongbuk-Do, Rep. of Korea

[21] Appl. No.: 773,593

[22] Filed: Dec. 27, 1996

[30] Foreign Application Priority Data

Dec. 28, 1995 [KR] Rep. of Korea ................... 1995 62056

[51] Int. Cl.$^6$ .................................................. H01L 21/84
[52] U.S. Cl. ........................................... 438/151; 438/589
[58] Field of Search ..................... 438/157, 149, 438/151, 589, 592

[56] References Cited

U.S. PATENT DOCUMENTS

| | | | |
|---|---|---|---|
| 5,317,432 | 5/1994 | Ino ............................................ | 359/59 |
| 5,348,899 | 9/1994 | Dennison et al. ...................... | 438/157 |
| 5,461,250 | 10/1995 | Burghartz et al. ..................... | 257/347 |
| 5,574,294 | 11/1996 | Shepard .................................. | 438/157 |
| 5,670,398 | 9/1997 | Yin et al. . | |

OTHER PUBLICATIONS

C.T. Liu, et al., "High Reliability and High Performance 0.35$\mu$m Gate–Inverted TFT's for 16 Mbit SRAM Applications Using Self–Alighed LDD Structures," IEDM, 1992, pp. 32.7.1 through 32.7.4.

*Primary Examiner*—Richard Booth
*Attorney, Agent, or Firm*—Morgan, Lewis & Bockius LLP

[57] ABSTRACT

A thin film transistor and method include a substrate and a first insulating layer having a trench portion. A first gate is formed on the first insulating layer and a second insulating layer is formed on the first gate. An active layer is formed on the second gate insulating layer and a third insulating layer is formed on the active layer. The second and third insulating layers include a contact hole. A second gate is formed on the third insulating layer and is connected to the first gate through the contact hole.

19 Claims, 4 Drawing Sheets

THIN FILM TRANSISTOR AND METHOD FOR MAKING SAME

BACKGROUND OF THE INVENTION

1. Field of the Invention

The present invention relates to a thin film transistor, and more particularly, to a thin film transistor and a method for making the same for a static random access memory (SRAM).

2. Discussion of the Related Art

FIGS. 1A and 1B are sectional views of a conventional polycrystalline silicon thin film transistor (TFT). FIG. 1A depicts a top gate type TFT having a gate on a silicon layer, and FIG. 1B depicts a bottom gate type TFT having a gate under a silicon layer.

A method for making the top gate type TFT of FIG. 1A is first explained below.

A method for making a P-channel metal oxide semiconductor (MOS) TFT or an N-channel MOS TFT includes a first step of forming a first oxide layer 12 (an insulating layer) on a substrate 10, forming a polysilicon layer 14 by a chemical vapor deposition technique thereon, and then forming a second oxide layer 16 on the polysilicon layer 14 as an insulating layer. In a second step, the second oxide layer 16 is selectively etched back, using an etching mask, to expose a predetermined part of the polysilicon layer 14 where a source/drain region is formed. Subsequently, in a third step, a gate electrode 18 is formed on the second oxide layer 16, and an impurity such as boron or phosphorus is implanted on the exposed surface of the polysilicon 14 to define a source/drain region (as indicated by shaded areas). In a fourth step, a metallic material for forming an electrode is applied over the gate 18, the source/drain region provided with the impurity, and the second oxide layer 16. Then, a selective etching process is carried out to form source and drain electrodes 20 with the gate electrode 18 between them. Accordingly, the formation of a top gate type TFT is complete.

Referring now to FIG. 1B, the steps in fabricating a bottom gate type TFT are basically similar to those of the top gate type TFT, except for the formation of a gate electrode under a polycrystalline silicon layer.

The steps in the fabrication of the bottom gate type TFT begin with sequentially forming a first oxide layer 12 (an insulating layer) and a gate electrode 18 on a substrate 10, and forming a thin polysilicon layer 14 over the gate electrode 18 and first oxide layer 12. In a second step, a second oxide layer 16 serving as an insulating layer is formed on the polysilicon layer 14. Then, the second oxide layer 16 is locally etched back, using an etching mask, to expose a predetermined part of the polysilicon layer 14 on both sides of the gate electrode 18. An impurity such as boron or phosphorus is implanted in the exposed surface of the polysilicon layer 14 to define a source/drain region (as indicated by shaded areas), which completes a third step. In a fourth step, a metallic material for forming an electrode is deposited over the second oxide layer 16 and the source/drain region (where the impurity is injected). The metallic layer is locally etched to form a source/drain electrode 20, thereby completing the formation of the bottom gate type TFT. Similar to conventional transistors formed on bulk silicon, if a voltage higher than that of the source electrode is applied to the drain electrode when a voltage higher than a threshold voltage is applied to the gate electrode, the electrons of such top gate type or bottom gate type TFTs flow from the source into the drain through a conducting channel to produce a drive current.

These TFTs may be easily fabricated on a substrate having a driving transistor and an access transistor as well as on a substrate of insulating material, which makes it possible to manufacture semiconductor devices including such transistors in a three-dimensional structure. They serve as a driving device for a liquid crystal display or load for a semiconductor memory device.

However, in the poly-Si TFT fabricated through a series of steps as discussed above and unlike bulk silicon transistors, the potential barrier formed due to a grain boundary in polysilicon causes a scattering of carriers. Such scattering decreases the carrier mobility when a channel is formed by applying a voltage to the gate. Thus, when the transistor is turned on, the drive current is significantly decreased, which has been identified as a cause of high leakage current—a problem that increases power consumption.

As the design requirements of a TFT are simplified in accordance with the improved integration of static random access memory, the channel width is decreased. This raises the threshold voltage and degradation occurs such as variation in effective channel width by power supply voltage. As a result, the capacitance of the semiconductor device becomes small, which increases the susceptibility to soft error causing transistor malfunctions.

SUMMARY OF THE INVENTION

Accordingly, the present invention is directed to a thin film transistor and method for making the same that substantially obviates one or more of the problems due to limitations and disadvantages of the related art.

An object of the present invention is to provide a thin film transistor and a method for making the same including inner and outer gates suitable for load resistors of highly integrated static random access memory (SRAM).

Another object of the present invention is to provide a thin film transistor and method that prevents high leakage current.

Another object of the present invention is to provide a thin film transistor and method that is immune to soft error.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a thin film transistor includes a substrate; a first insulating layer having a trench portion on the substrate; a first gate on the first insulating layer; a second insulating layer on the first gate; an active layer on the second insulating layer; a third insulating layer on the active layer, the second and third insulating layers including a contact hole; and a second gate on the third insulating layer and connected to the first gate through the contact hole.

In another aspect, the present invention provides a method for making a thin film transistor having a substrate including the steps of forming a first insulating layer having a trench portion on the substrate; forming a first gate on the first insulating layer; forming a second insulating layer on the first gate; forming an active layer on the second insulating layer; forming a third insulating layer over the second insulating layer and the active layer; etching the second and third insulating layers to form a contact hole and exposing the first gate; and forming a second gate over the third insulating layer and the contact hole.

In another aspect, the present invention provides a thin film transistor including a substrate; an insulating layer formed on the substrate having a trench on a predetermined part; an outer gate formed on the insulating layer; a first gate insulating layer formed on the outer gate; an active layer formed on the first gate insulating layer; a second gate insulating layer formed on the first gate insulating layer having the active layer; and an inner gate formed on the second gate insulating layer to be connected with the outer gate through a contact hole on one side.

In a further aspect, the present invention provides a method for making a thin film transistor including the steps of forming on a substrate an insulating layer with a trench on a predetermined part; forming an outer gate on the insulating layer; forming a first gate insulating layer on the outer gate; forming an active layer on the first gate insulating layer; forming a second gate insulating layer over the first gate insulating layer having the active layer; etching the first and second gate insulating layers to expose the outer gate, and forming a contact hole; and forming an inner gate over the second gate insulating layer and the contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings.

The present invention provides a polycrystalline silicon thin film transistor (TFT) adequate for application with load resistors of a highly integrated static random access memory (SRAM). The steps for carrying out the manufacture of a thin film transistor of the present invention is shown in FIGS. 2A to 2D.

Figure 1A:
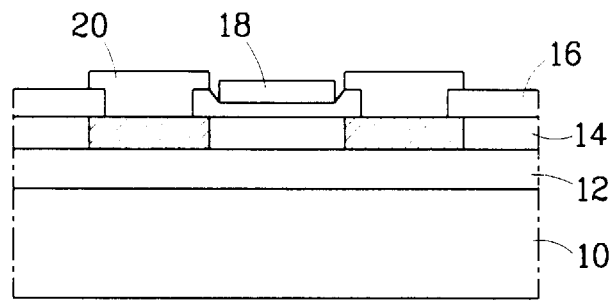
FIG. 1A is a sectional view of a conventional top-gate type thin film transistor.
Figure 1B:
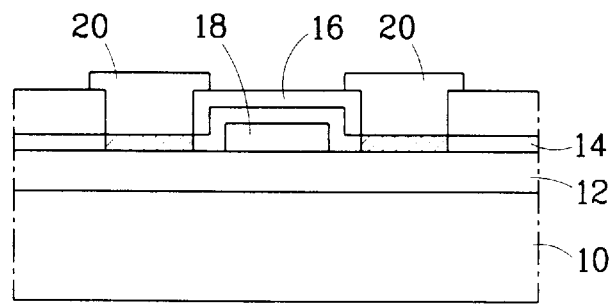
FIG. 1B is a sectional view of a conventional bottom-gate type thin film transistor.
Figure 2A:
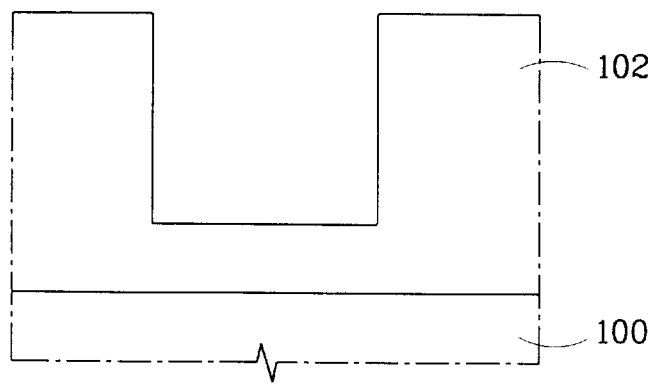
FIGS. 2A to 2D illustrate the steps in the manufacture of a thin film transistor in accordance with the present invention.
Figure 2B:
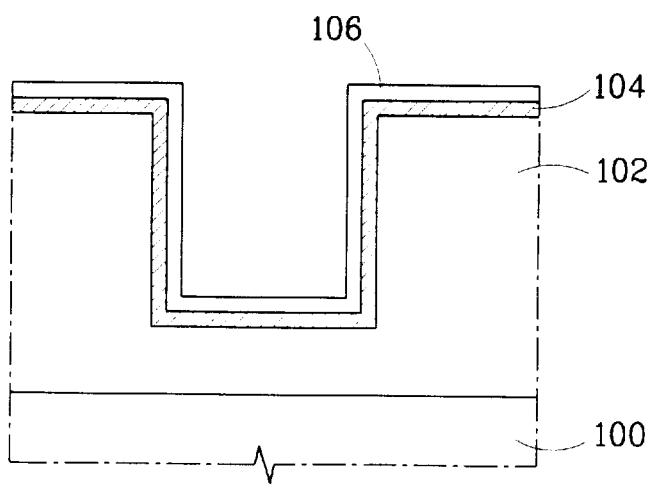

Referring to FIG. 2A, an oxide layer 102 (an insulating layer) is formed on a silicon substrate 100. The oxide layer 102 is locally etched back to form a channel having a predetermined depth using an etching mask to form a trench portion. As shown in FIG. 2B, a conductive material, e.g. a doped polysilicon layer, is deposited thinly over the oxide layer 102 and then etched using an etch mask to form an outer gate 104. A first gate insulating layer 106, such as an oxide layer, is formed over the outer gate 104, as shown in FIG. 2B.

Figure 2C:
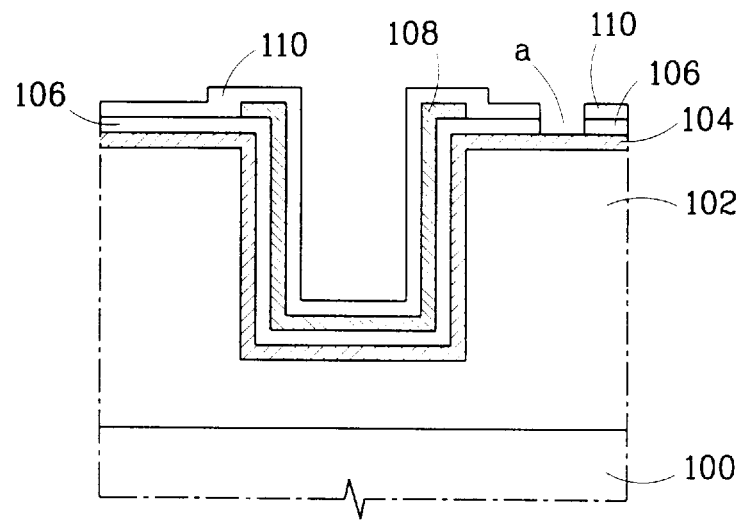

Referring now to FIG. 2C, an active layer 108, such as a silicon layer, is formed and is locally etched back by using a mask to cover only a predetermined portion of the first gate insulating layer 106, thus lining the channel. A second gate insulating layer 110 (an oxide layer) is deposited on the first gate insulating layer 106 having the active layer 108. The second gate insulating layer 110 will be connected to an inner gate that will be formed in the following steps. The first and second gate insulating layers at a predetermined portion on the upper surface of the channel are etched back to expose a portion of the outer gate 104, and a contact hole "a" is formed.

When the insulating layer 102 is etched back to form an active region for forming a channel, as described above, a larger channel width is attained while being within the same design requirement, thereby lowering the threshold voltage.

Figure 2D:
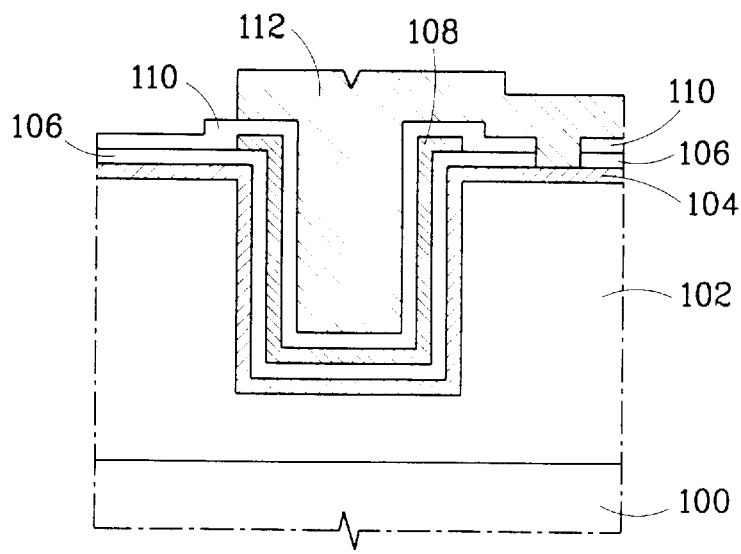

Turning to FIG. 2D, a conductive material, such as doped polysilicon, is deposited over the second gate insulating layer 110 and the exposed surface of the outer gate 104. The conductive material is thicker than the outer gate 104. This polysilicon layer is then etched, using a mask, to form an inner gate 112.

By using the inner gate 112 as a mask, a high concentration n-type or p-type impurity is ion-implanted in the silicon substrate 100. Subsequently, a thermal treatment process is carried out to overcome defects that may occur from ion-implantation and for electrical activation of regions where the impurity is ion-implanted. In this instant, source/drain electrodes 114 (shown in FIG. 3) are formed in the regions where the impurity is ion-implanted within the silicon substrate 100, thereby completing the inventive process.

Accordingly, the TFT of the present invention includes the outer gate 104, the first gate insulating layer 106, and the active layer 108 for forming a channel. The active layer 108 which lines the channel of the TFT according to the present invention, is disposed above the outer gate 104 with the first gate insulating layer 106 therebetween, and disposed below the inner gate 112 with the second gate insulating layer 110 therebetween. The TFT of the present invention also includes a contact hole "a" through which the inner gate 112 and outer gate 104 are connected to each other.

Accordingly, when voltage is applied to the gates, a field distribution within the channel may be efficiently controlled by the outer gate 104 and inner gate 112 to attain a uniform magnetic field in a vertical direction within the channel. This increases drive current and significantly reduces the threshold voltage swing that may be caused by the high integration of the semiconductor device.

Figure 3:
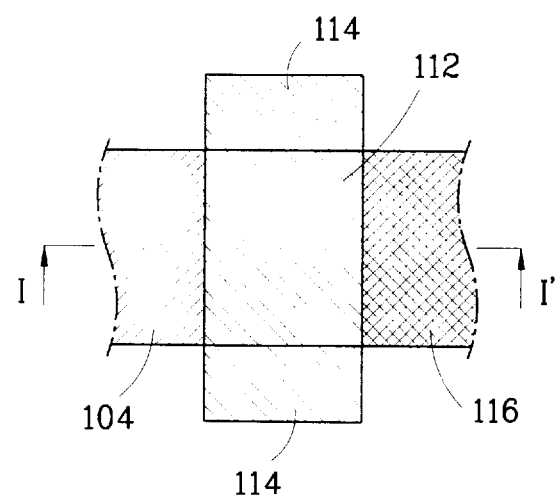
FIG. 3 is a schematic plan view of inner and outer gates of the thin film transistor in FIG. 2D.

FIG. 3 is a plan view of a thin film transistor having the structure as discussed above. Here, the part which is designated by reference numeral 104 indicates an outer gate, the part which is designated by reference numeral 112 indicates an inner gate, and the part which is designated by reference numeral 116 indicates a portion where the inner gate 112 and the outer gate 104 are connected with each other through a contact hole "a". FIG. 2D is a sectional view taken along line I–I' of FIG. 3. Since the first gate oxide layer 106 is formed between the outer gate 104 and active layer 108 and the second gate oxide layer 110 is formed between the inner gate 112 and active layer 108, the capacitance of the oxide layer structure becomes significantly large, which prevents soft error which may occur when exposed to α-light, for example.

The thin film transistor of the present invention has a high reliability and prevents both soft and narrow channel effects for a thin film transistor of a small size (decreased by design requirements). The present invention increases drive current by efficiently controlling the field distribution within the channel. Moreover, the present invention improves the characteristics of the semiconductor device by preventing soft error that may occur when exposed to α-light. Thus, the integration of a semiconductor device is enhanced when the thin film transistor of the present invention is applied to SRAMs.

Accordingly, the present invention provides a thin film transistor and method for making the same including outer and inner gates suitable for load resistors of highly integrated SRAMs.

It will be apparent to those skilled in the art that various modifications and variations can be made in the thin film transistor and method for making the same of the present invention without departing from the spirit or scope of the invention. Thus, it is intended that the present invention cover the modifications and variations of this invention provided they come within the scope of the appended claims and their equivalents.

What is claimed is:

1. A method for making a thin film transistor having a substrate, the method comprising the steps of:

forming a first insulating layer on the substrate, the first insulating layer having a trench portion;

forming a first gate on the first insulating layer;

forming a second insulating layer on the first gate;

forming an active layer on the second insulating layer;

forming a third insulating layer over the second insulating layer and the active layer;

etching the second and third insulating layers to form a contact hole and exposing the first gate; and forming a second gate over the third insulating layer and the contact hole, wherein the second gate is thicker than the first gate.

2. A method for making a thin film transistor having a substrate, the method comprising the steps of:

forming a first insulating layer on the substrate, the first insulating layer having a trench portion:

forming a first gate on the first insulating layer;

forming a second insulating layer on the first gate;

forming an active layer on the second insulating layer;

forming a third insulating layer over the second insulating layer and the active layer;

etching the second and third insulating layers to form a contact hole and exposing the first gate;

forming a second gate over the third insulating layer and the contact hole; and ion-implanting a high concentration impurity in the substrate by using the second gate as a mask.

3. The method according to claim 2, wherein the high concentration impurity is an n-type impurity.

4. The method according to claim 2, wherein the high concentration impurity is a p-type impurity.

5. The method according to claim 2, further comprising a step of:

thermally treating a resultant device after the step of ion-implanting.

6. The method according to claim 2, further comprising a step of:

forming source and drain electrodes in regions where the impurity is ion-implanted within the substrate.

7. The method according to claim 2, wherein each of the first and second gates includes a conductive material.

8. The method according to claim 2, wherein the first gate is an outer gate and includes a doped polysilicon.

9. The method according to claim 2, wherein the second gate is an inner gate and includes a doped polysilicon.

10. The method according to claim 2, wherein the active layer includes silicon.

11. The method according to claim 2, wherein the contact hole is formed at one side of the trench.

12. The method according to claim 2, wherein the step of forming the first insulating layer includes steps of:

forming an insulating film on the substrate; and locally etching the insulating film to form the trench portion.

13. The method according to claim 12, wherein the step of forming the insulating film includes a step of forming an oxide layer on the substrate.

14. The method according to claim 2, wherein the substrate is substantially planar.

15. The method according to claim 2, wherein the step of forming the first gate includes a step of forming at least a part of the first gate inside the trench portion.

16. The method according to claim 2, wherein the step of forming the second insulating layer includes a step of forming at least a part of the second insulating layer inside the trench portion.

17. The method according to claim 2, wherein the step of forming the active layer includes a step of forming at least a part of the active layer inside the trench portion.

18. The method according to claim 2, wherein the step of forming the third insulating layer includes a step of forming at least a part of the third insulating layer inside the trench portion.

19. The method according to claim 2, wherein the step of forming the second gate includes a step of forming at least a part of the second gate inside the trench portion.

* * * * *